(12) United States Patent
Hines et al.

(10) Patent No.: US 8,441,168 B2
(45) Date of Patent: *May 14, 2013

(54) SAW SENSOR TAGS WITH ENHANCED PERFORMANCE

(75) Inventors: Jacqueline H. Hines, Annapolis, MD (US); Leland P. Solie, Chetek, WI (US)

(73) Assignee: Applied Sensor Research & Development, Arnold, MD (US)

( * ) Notice: Subject to any disclaimer, the term of this patent is extended or adjusted under 35 U.S.C. 154(b) by 797 days.

This patent is subject to a terminal disclaimer.

(21) Appl. No.: 12/537,006

(22) Filed: Aug. 6, 2009

(65) Prior Publication Data

US 2010/0060429 A1    Mar. 11, 2010

Related U.S. Application Data

(60) Provisional application No. 61/086,715, filed on Aug. 6, 2008.

(51) Int. Cl.
*H01L 41/04* (2006.01)

(52) U.S. Cl.
USPC ...................................... 310/313 R

(58) Field of Classification Search ............. 310/313 R, 310/313 A, 313 B, 313 C, 313 D
See application file for complete search history.

(56) References Cited

U.S. PATENT DOCUMENTS

| 6,531,957 | B1 * | 3/2003 | Nysen | 340/10.1 |
| 2002/0062694 | A1 * | 5/2002 | Ehrfeld et al. | 73/593 |
| 2004/0169570 | A1 * | 9/2004 | Yip et al. | 333/195 |

* cited by examiner

*Primary Examiner* — Derek Rosenau
(74) *Attorney, Agent, or Firm* — Saul Ewing LLP

(57) ABSTRACT

The subject of the present invention is a set of SAW (surface acoustic wave) based sensor tag device embodiments system for remotely sensing and/or providing identification information. These sensor/tag devices would operate in a system which consists of one or more uniquely identifiable sensor/tag devices and a wireless interrogator. The sensor device incorporates an antenna for receiving incident RF energy and re-radiating the tag identification number and the sensor measured parameter(s). Since there is no power source in or connected to the sensor, it is a passive sensor. As such the device is elegantly simple, low-cost, and rugged. The device is wirelessly interrogated by the interrogator which is described elsewhere.

20 Claims, 14 Drawing Sheets

SAW SENSOR TAGS WITH ENHANCED PERFORMANCE

RELATED APPLICATION

This application claims priority U.S. Provisional Patent Application Nos. 61/086,715 filed Aug. 6, 2008, which is incorporated herein by reference in their entireties.

BACKGROUND

In order to provide an understanding of the aspects of the devices described in the present invention, it is necessary to first discuss prior art in the fields of SAW RFID tags, passive wireless coded SAW sensors and SAW sensor-tag interfaces. Much work in this area has been done since the early 1990s, a summary of which is provided below.

SAW RFID Tags—Prior Art:

SAW devices have been used as radio frequency identification device (RFID) tags since the late 1980's and early 1990's. SAW RFID tags are passive responders, wherein an incident RF signal is captured by an antenna attached to the tag, activates the SAW tag, and is re-transmitted as the reflected (S11) response of the SAW device. Traditional single frequency SAW RFID tags consist of a piezoelectric substrate, generally selected to be temperature stable (hence quartz was a commonly preferred substrate), with a single input/output transducer and a set of reflective taps positioned at various delays on either side of the transducer. The reflective taps are positioned in time "slots" that are separated far enough in time to allow the reflections from any two successive slots to be resolved. The S11 response of a traditional SAW RFID tag consists of a sequence of time domain pulses such that in each successive time slot the existence of a pulse is read as a "1" and the absence of a pulse is read as a "0". If the code is N time slots long, then the number of unique codes is $2^N$. The use of two-sided single acoustic track device configurations allowed the designer to incorporate more time slots then would be possible with a single-sided layout. In addition to placing constraints on the number of possible codes for a given device size, the time extent of each time slot (with guardbands on each side to prevent misidentification of taps) also limits the time extent of each reflecting tap. This limits the number of reflecting strips in each tap, which reduces the possible reflection for each tap. Another factor limits the number of possible taps as well. Since the taps are located in the same acoustic track, if taps close to the input/output transducer reflect SAW energy, that removes SAW energy from the wave propagating further out in the track, which means that there is less to be received and reflected from the taps farther out from the transducer. The result is that the signals reflected from sequential taps are of decreasing strength. This effect can be compensated for somewhat by increasing the number of electrodes in the taps that are further from the transducer, but this can introduce significant intertap reflection problems. Intertap reflections occur when the SAW reflected by one tap reflects off of a tap closer to the transducer and propagates once again away from the transducer, only to be reflected from taps further away in the SAW path. In order to avoid intertap reflection problems and allow the SAW energy to propagate and be reflected by multiple taps, it is necessary to keep the total reflectivity of each tap low. Low tap reflectivity, however, results in high reflection loss. The time domain response of typical SAW RFID tags at 2.45 GHz are generally 55 dB or more with approximately 32 taps [1,2] and can exceed 70 dB for devices with many more tap positions. The smaller the number of reflective taps needed to effect the desired number of codes, the lower the possible insertion loss and vice-versa.

In addition to simple on-off coding involving tap positions, a number of other coding techniques have been applied to SAW RFID tags. Phase shift keying has resulted in a higher signal to noise ratio than simple on-off coding, while advanced techniques such as overlapped pulse position modulation combined with phase offsets and multiple pulses per group have been shown to enable larger codesets with adequate signal levels [2,3].

Another method used to avoid intertap reflections and achieve larger codesets is to design devices with multiple parallel acoustic tracks. Input transducers can be connected electrically in series or parallel, with each transducer having a two-sided acoustic track. This reduces the number of reflective taps in each track and allows the designer to use more reflective electrodes in each tap without concern for intertap reflections. However, these techniques also suffer from power division losses in the transducers, and hence cannot substantially reduce insertion loss.

All of the previously discussed SAW RFID tag approaches can be grouped together as reflective delay line techniques. Another type of well known SAW RFID tag uses a resonator approach instead. This type of device consists of multiple SAW resonators that are connected in parallel via matching networks to a common antenna. These very narrowband resonators are designed to be separate in frequency, with guardbands sufficient to ensure that frequencies will not overlap over the operating range of the device. Presence or absence of a response at each frequency constitutes a "1" or a "0" in the corresponding code position. Sensing (for example temperature) can be incorporated in the device by including one or more resonators built on substrates with different characteristics (such as TCD), and monitoring the change in resonance frequency for this resonator measured differentially relative to another reference resonator in the response. [4]

Any of the known SAW RFID tag approaches can be implemented on SAW substrates with properties appropriate for use as sensors. Temperature sensors have been demonstrated [5], and other sensors are possible using similar techniques. Frequency modulated continuous wave (FMCW) interrogation system have been used commercially for temperature sensors on 128 lithium niobate (as in the Baumer-Ident module discussed by Reindl [5]) with total bandwidths of 40 MHz at 2.45 GHz, and pulse position modulation coding enabling $10^4$ codes. In this system, a rough measurement of temperature is obtained by evaluating gross delay, and a finer temperature measurement is obtained by using the gross measurement to eliminate the phase ambiguity of $2\pi$ and subsequently utilizing phase to calculate temperature with a resolution of ±2° C. [5]. This approach is extended by Kuypers [6] to achieve accuracies of approximately ±0.1° C.

A wide range of additional work has been done in the area of passive wireless SAW sensor/tag devices, including [7-9]. Reference [10] provides an analysis of the performance achievable using several of the aforementioned algorithms.

Passive Wireless Coded SAW Sensors—Prior Art:

Previously described passive wireless SAW sensors without coding utilize either use the frequency of a resonator or the time delay of a delay line as the parameter for indicating a measured quantity. Multiple sensors could be used in a single wireless system, provided the techniques of frequency diversity or time diversity were used, i.e. multiple resonators at different frequencies or multiple delay lines with different delays or different differential delays were used. In such systems, it was necessary to design these devices with enough frequency separation or enough time separation that the responses of individual sensors would not overlap even when they experience variations in the sensed parameter(s). This necessarily limited the number of potential sensors dramatically, as both time delay and bandwidth are limited.

In the past few years, the inventors have been working with Dr. Don Malocha at the University of Central Florida on development of another type of SAW sensor. Initially envisioned as an Orthogonal Frequency Coded (OFC) SAW sensor, these devices would operate passively, responding to an RF interrogation signal with a reflected signal containing the ID code of the sensor and the measurement of the sensed parameter. Original OFC devices utilized a wideband input/output transducer, and frequency coded reflective arrays in a differential delay line configuration to provide both sensing capability and a unique ID code. The inventors have developed various different embodiments in the past few years, incorporating time and frequency diversity, and modifying the requirements for utilization of strictly orthogonal frequency bands, which are described elsewhere [11]. All of these devices benefit from the use of spread spectrum techniques, whereby a wide frequency band is utilized to interrogate the sensor, and correlation of the sensor response is used to extract both the sensor ID and the measured data with additional processing gain providing higher accuracy of delay measurement than would be achievable through single frequency approaches.

In addition to these approaches, Reindl [12] and Benes [13] both demonstrated that the use of chirp-radar-like techniques in SAW sensors can enhance device sensitivity. Reindl utilized a two-tap delay line with a wideband transducer feeding two chirped reflectors, where the reflectors had opposite chirp sense. Compression of the sensor response in the interrogator and evaluating the difference between the upchirp and the downchirp response provided an increase in sensitivity by a factor of 10 to 100. Benes stated that compression of spread spectrum signals in SAW matched filters (as used in radar systems) can be used to discriminate between different sensors operating in the same frequency band (i.e. to code the sensors), and that using chirp interrogation signals (of traditional SAW RFID devices) with time inverse SAW matched filters in the receiver can increase the effective delay of the SAW sensor and enhance measurement resolution (0.1 mK for temperature is cited for lithium niobate sensors). Ostermayer also discussed CDMA coding techniques for multiple sensor systems using SAW devices [14].

SAW Sensor-Tag Wireless Interfaces:

Another application for SAW devices is to function as a wireless interface to other passive sensors. Brocato demonstrated that a SAW differential delay line could be used, with a sensor that changes impedance with measured quantity attached electrically in parallel with a reflector in one of the paths, to measure variations in the attached sensor [15] Other researchers have also demonstrated similar devices [7, 16, 17]. In one case, operation of a switch was demonstrated. In this example, the devices exhibited a significant amount of self resonance, and what was observed and measured was the amplitude of the reflective response as it rings down. Ringing in the electronic circuit and the direct RF reflection complicates the interpretation of the response signal in this approach. Reading of the reflected signal is not possible until the direct reflections have died out.

Summary of Limitations of Prior Art:

In conclusion, a significant problem with the conventional SAW RFID tag is the high reflection loss. A problem with current passive wireless coded SAW sensors is the limited number of sensor codes that will operate simultaneously.

Significant problems with current SAW sensor-tag interfaces include difficulty in interpreting the reflected device response. The present inventions are intended to address each of these issues.

SUMMARY

The subject of the present invention is a set of SAW (surface acoustic wave) based sensor tag device embodiments and system for remotely sensing and/or providing identification information. These sensor/tag devices would operate in a system which consists of one or more uniquely identifiable sensor/tag devices and a wireless interrogator. The sensor device incorporates an antenna for receiving incident RF energy and re-radiating the tag identification number and the sensor measured parameter(s). Since there is no power source in or connected to the sensor, it is a passive sensor. As such the device is elegantly simple, low-cost, and rugged. The device is wirelessly interrogated by the interrogator which is described elsewhere.

DETAILED DESCRIPTION OF THE INVENTION

Tapered SAW ID Tags and Sensors

The first approach in this invention uses tapered transducers and tapered reflectors to reduce the loss associated with delay line sensors and tags. The electrodes of conventional transducers are straight and parallel. In conventional transducers and reflectors, the bandwidth is determined by the time extent of the transducer or reflector (i.e. the number of electrodes), and the electrode spacing determines the center frequency. In tapered transducers the pitch or spacing between the electrodes varies continuously across the aperture so that the frequencies that are transmitted or detected varies across the aperture, with lower frequencies where the period is greater and the higher frequencies where the period is less.

This means that the tapered transducer has a bandwidth which is not limited by the number of electrodes but by the change in the period of the electrodes across the aperture. At any frequency (within the bandwidth of the transducer) there is a position across the aperture which exactly matches the wavelength of that frequency and so the number of electrodes can be increased to any reasonable number in order to increase the coupling strength for transmitting or receiving a SAW at that frequency, without affecting the transducer bandwidth. The result is that the tapered transducer can be much more efficient than a conventional transducer, and can produce significantly lower insertion losses, particularly over a wide bandwidth.

Likewise with a tapered reflector the bandwidth is controlled by the variation in electrode pitch across the aperture and not by the number of electrodes. There is a point within the aperture where the wavelength of the SAW is exactly equal to one half the pitch of the electrodes and since the number of electrodes can be increased, the reflection can be as strong as desired.

Figure 1:
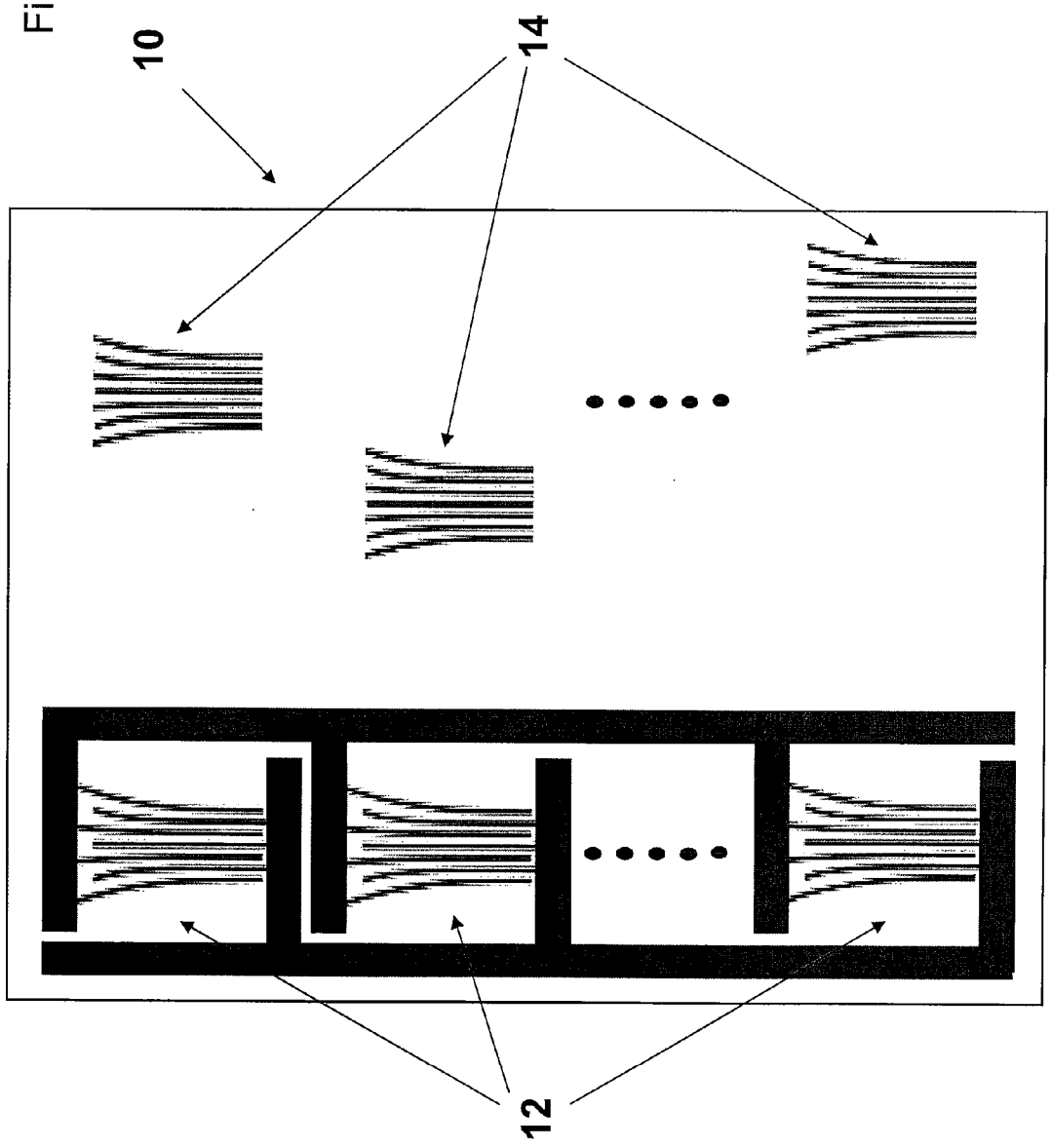
FIG. 1 is a SAW sensor/tag implementation in accordance with a first embodiment.

In the SAW sensor/tag implementation 10 shown in FIG. 1 there is a tapered transducer 12 for each tapered reflector 14. Each transducer/reflector pair corresponds to one bit in the code and spacing between the two elements determines the time delay of the bit just as in a conventional delay line tag. The reflector occupies more space in the path (longitudinally) than the small number of reflecting lines in a conventional tag so it is not possible to have more than one bit on each side of each transducer, as the reflectors would likely overlap one another. Further, the reflectivity of the tapered tap can be so high that there is not sufficient energy left in the acoustic track after one reflection to support a second reflector, plus the intertap reflections would be too high if there were more than one reflector in a track. Thus, in the single sided implementation shown in FIG. 1 there is one bit for each transducer/reflector pair.

Figure 2:
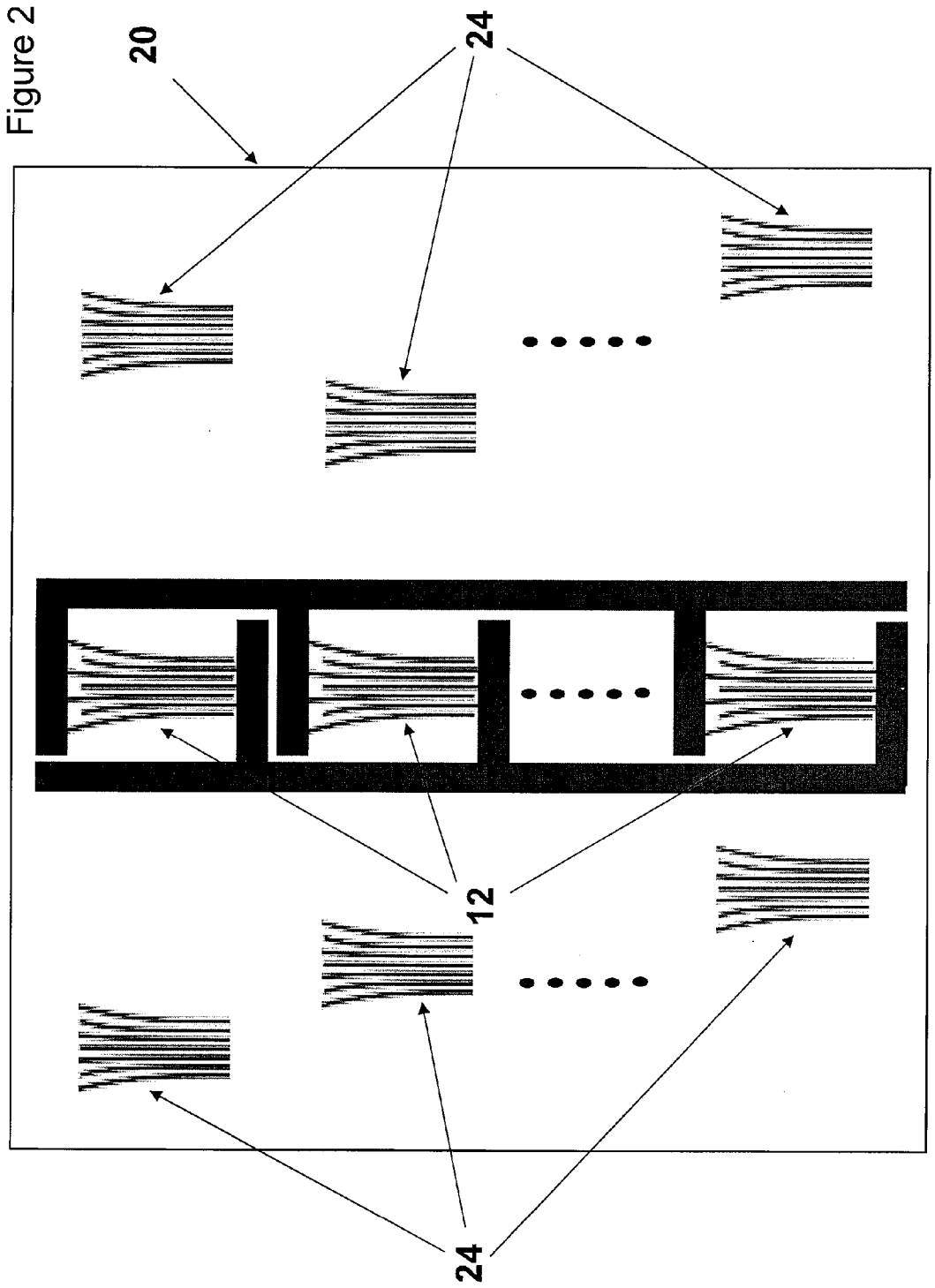
FIG. 2 is a SAW sensor/tag implementation in accordance with a second embodiment.

In FIG. 2 a double sided SAW sensor/tag implementation 20 is shown in which there are two reflectors 24 for each transducer 12, one on either side of the transducer. This helps reduce the size of the die, which is a design consideration since the tapered structures use more area on the die than conventional tag design. For both embodiments, the reflector losses can be significantly lower than conventional non-tapered single track SAW RFID tag devices. And since conventional multi-track devices that are implemented using transducers in parallel experience the same power division loss as the tapered embodiments shown, the devices shown in FIGS. 1 and 2 will have lower overall loss than the corresponding non-tapered devices.

Figure 3:
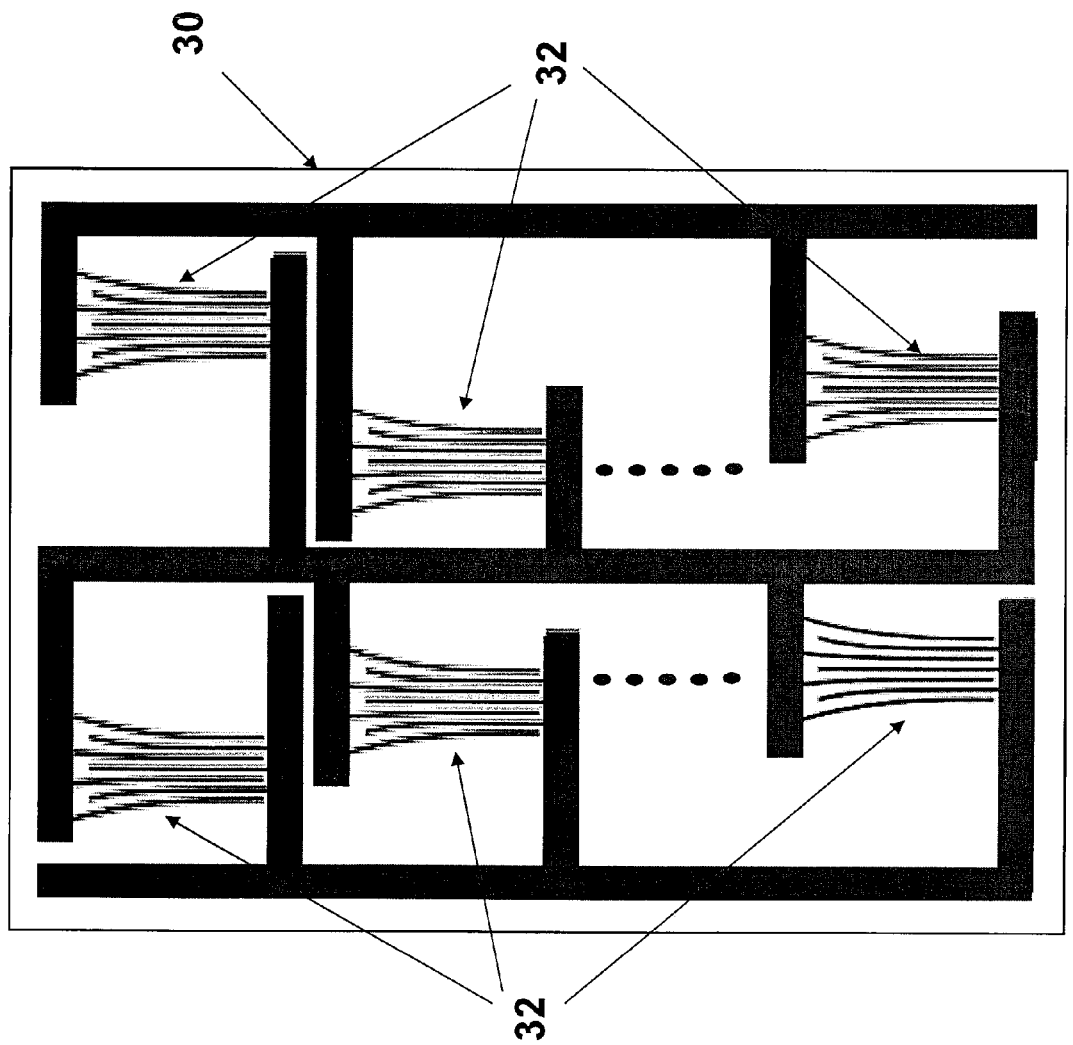
FIG. 3 is a SAW sensor/tag implementation in accordance with a third embodiment.

In FIG. 3, another sensor/tag embodiment 30 is shown that utilizes tapered transducer elements 32 only (i.e. no reflector elements). The multiple tapered transducers are connected electrically in parallel, and due to the reciprocal operation of SAW devices, the reflected response of this embodiment will provide a response similar to those produced by the devices shown in FIGS. 1 and 2. In this embodiment, each track provides one bit of the code, and since the acoustic wave propagation path is not reflective, the delay will correspond to a single transit of the substrate between the pairs of transducers. In addition, the reflection loss of this embodiment will be significantly lower (as much as 10 dB) than the already reduced loss of the devices in FIGS. 1 and 2, since the device of FIG. 3 experiences only transducer loss (twice), while the other embodiments experience the same transducer loss and also experience reflector loss.

Figure 4:
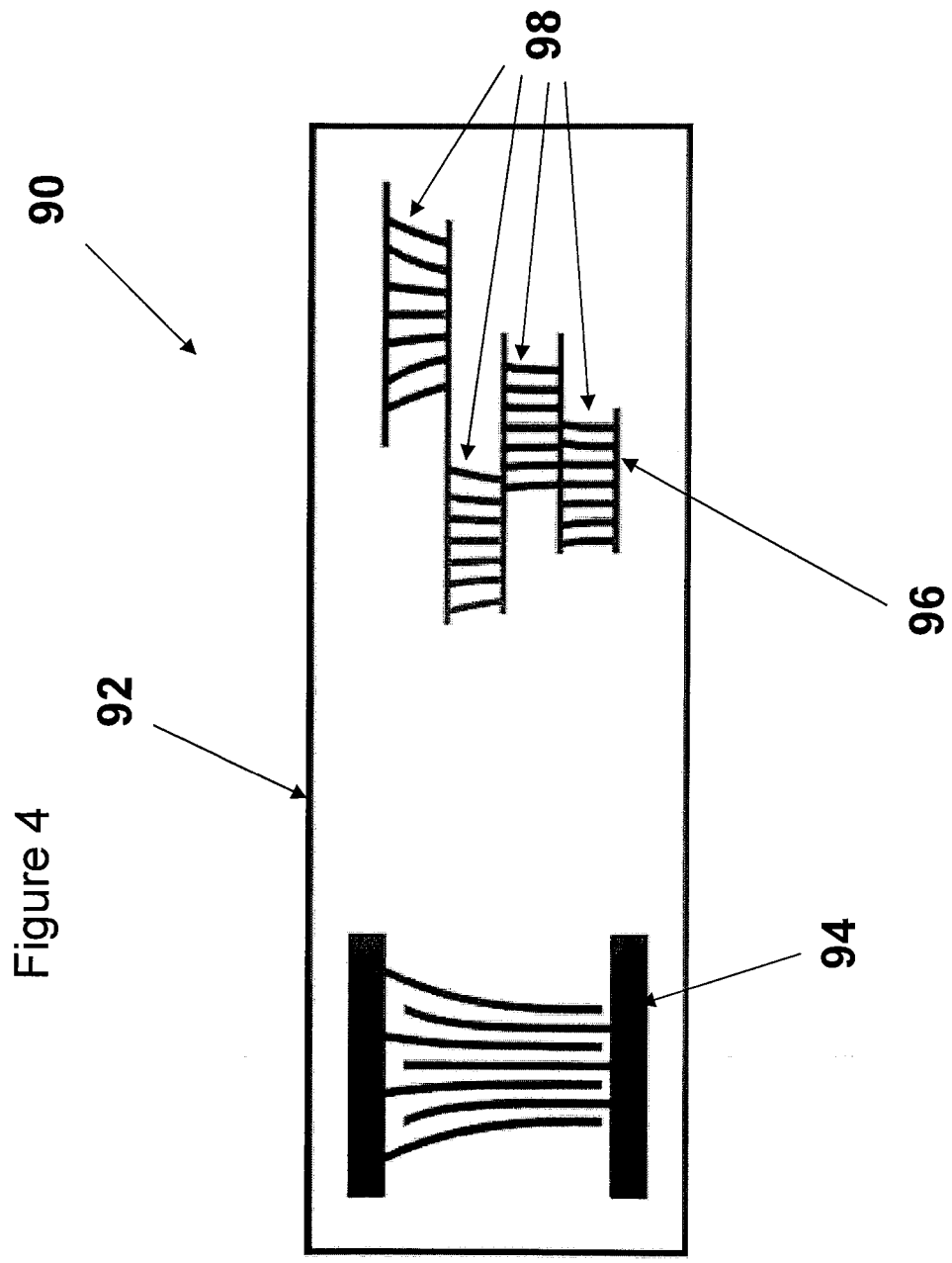
FIG. 4 is a SAW sensor/tag implementation in accordance with a fourth embodiment.

So far it has been assumed that every transducer and reflector element will function over the full device bandwidth. Alternatively, it is possible in all of these structures to utilize a single tapered transducer and reflectors that reflect over distinct sub-bands of the overall bandwidth. This avoids the power division loss that occurs when transducers are connected in parallel (four transducers will result in 12 dB of loss due to power division in a reflective process). In addition, the die size can be substantially reduced, since only one tapered transducer is required, whereas five or more are shown in the previous examples. (Note: The aperture of the single transducer will be equal to that of each transducer shown in FIGS. 1-3). One embodiment of this low-loss tag 90 is shown in FIG. 4, wherein a single tapered transducer 94 on piezoelectric substrate 92 provides a SAW signal to 4 different tapered reflectors 98 that comprise reflector 96. Each of the four tapered reflectors 98 is positioned on the substrate at a specified delay from transducer 94, effecting different delays for each reflector frequency and hence a code. The acoustic aperture is divided into 4 equal parts and because of the nature of a tapered transducer this divides the frequency bandwidth into 4 equal parts. A consequence of the division in frequency is that each bit has only ¼ the bandwidth of the full frequency bits and so the bits are not as sharp or well defined in time as the full frequency bits. This may or may not be a problem and is up to the system designer to make the trade-off. Obviously the division by 4 could be done by any integer number to produce low-loss devices with a single tapered transducer and multiple reflector channels, each with a narrower frequency range. When a large number of bits are needed in a code it would be useful to have several bits per transducer. These structures could be double sided as well.

Figure 5:
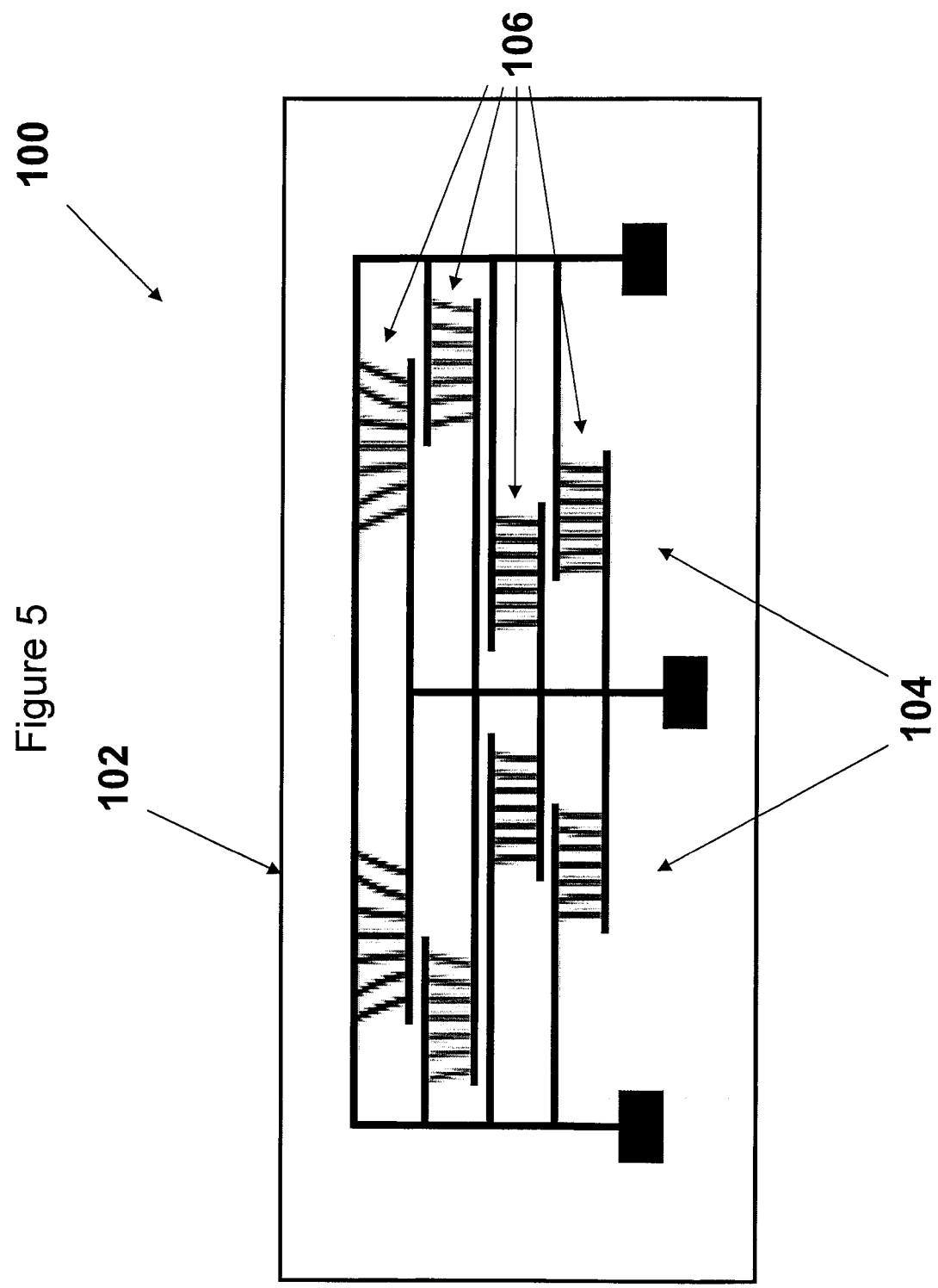
FIG. 5 is a SAW sensor/tag implementation in accordance with a fifth embodiment.

FIG. 5 shows yet another implementation of this low-loss approach 100 using a pair of tapered transducers 104 on a piezoelectric substrate 102 that have been split into N parallel acoustic subchannels or tracks 106, each with a narrower bandwidth such that the combination of the N tracks covers the entire bandwidth of the original transducers. The total acoustic aperture of all N tracks will be equal to the acoustic aperture of one transducer in FIG. 3, again producing a substantial reduction in die size while eliminating power division losses and reflection losses to provide a low loss response.

Any of a wide range of known coding techniques can be implemented using tapered transducers and reflectors, in addition to the simple on-off keying of the tap responses discussed. It would be understood by one versed in the art that phase modulation, pulse position modulation, and many other techniques could be used to enhance the number of codes available. The use of multiple delay "slots" within each code reflector nominal delay position is widely used to achieve increased code set size, and the use of multiple pulses per data group is also well known. Any of these techniques could be utilized in the aforementioned device embodiments to increase the number of sensors that can work together in a system.

The tapered transducers and/or reflectors described thus far are all non-dispersive, and similar embodiments could be envisioned that utilize slanted transducers, stepped tapered transducers, and waveguide devices. However, slanted transducers, stepped tapered transducers, waveguides, and continuously tapered transducers could also be used in the dispersive and harmonic techniques discussed below to achieve lower loss. Finally, devices utilizing such structures could be useful for RFID tag applications, sensor applications, combined sensor/tag applications, and wireless sensor/tag interface applications.

Dispersive SAW ID Tags and Sensors

Another aspect of the present invention is the use of dispersive transducers in various locations within the sensor/tag device, to perform pulse expansion and compression in ways that are advantageous to reduce device loss (through the introduction of processing gain).

In general, chirped or linear FM dispersive signals, transducers, and reflectors can be used to achieve processing gain and reduce loss. Nonlinear chirp devices have been used to demonstrate enhances mass sensitivity. The position of the various dispersive signals and elements within the system can be adjusted to achieve various desired performance goals, all of which are variations of the delay line tag approach.

Figure 6:
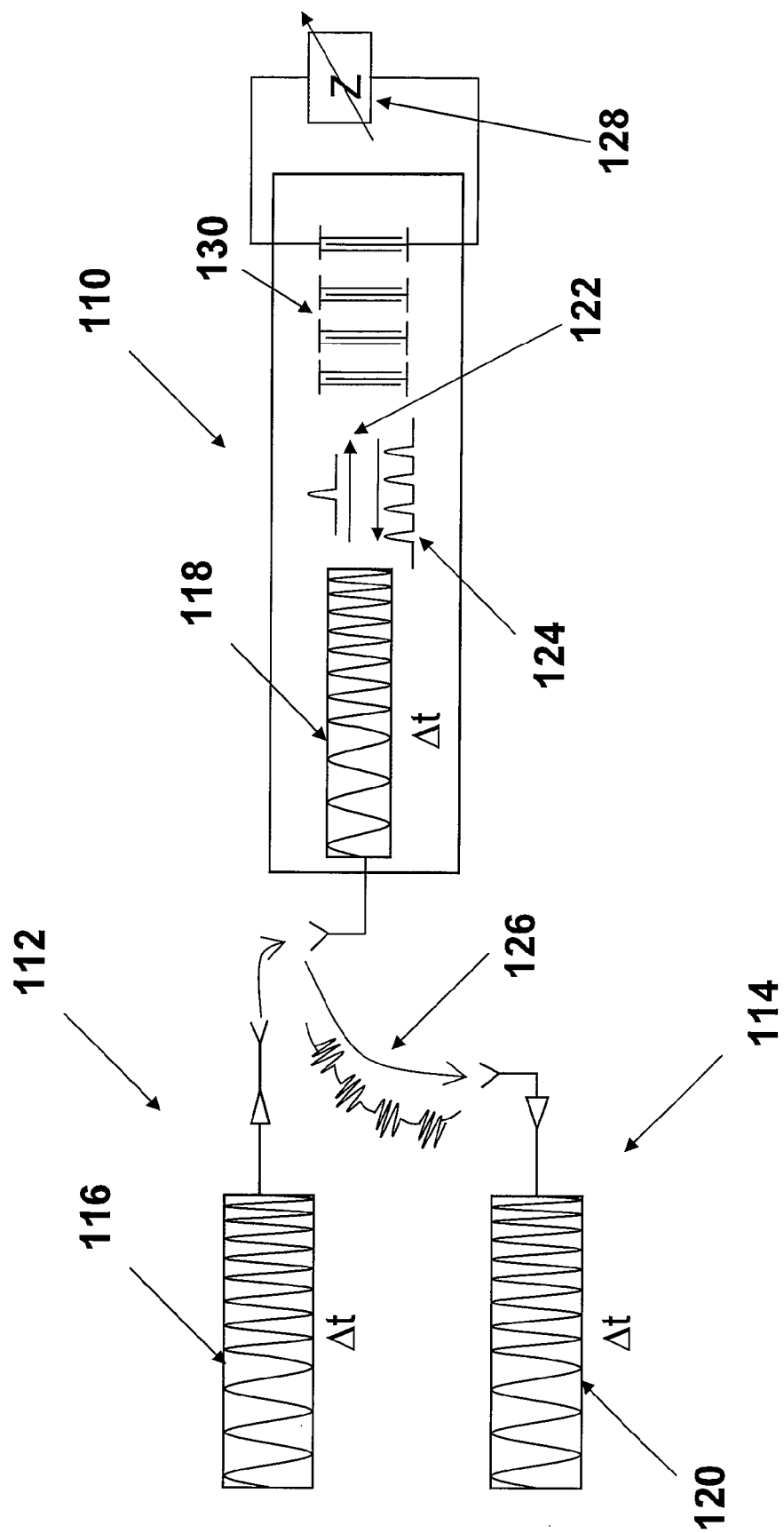
FIG. 6 is a SAW sensor/tag implementation in accordance with a sixth embodiment.
Figure 7:
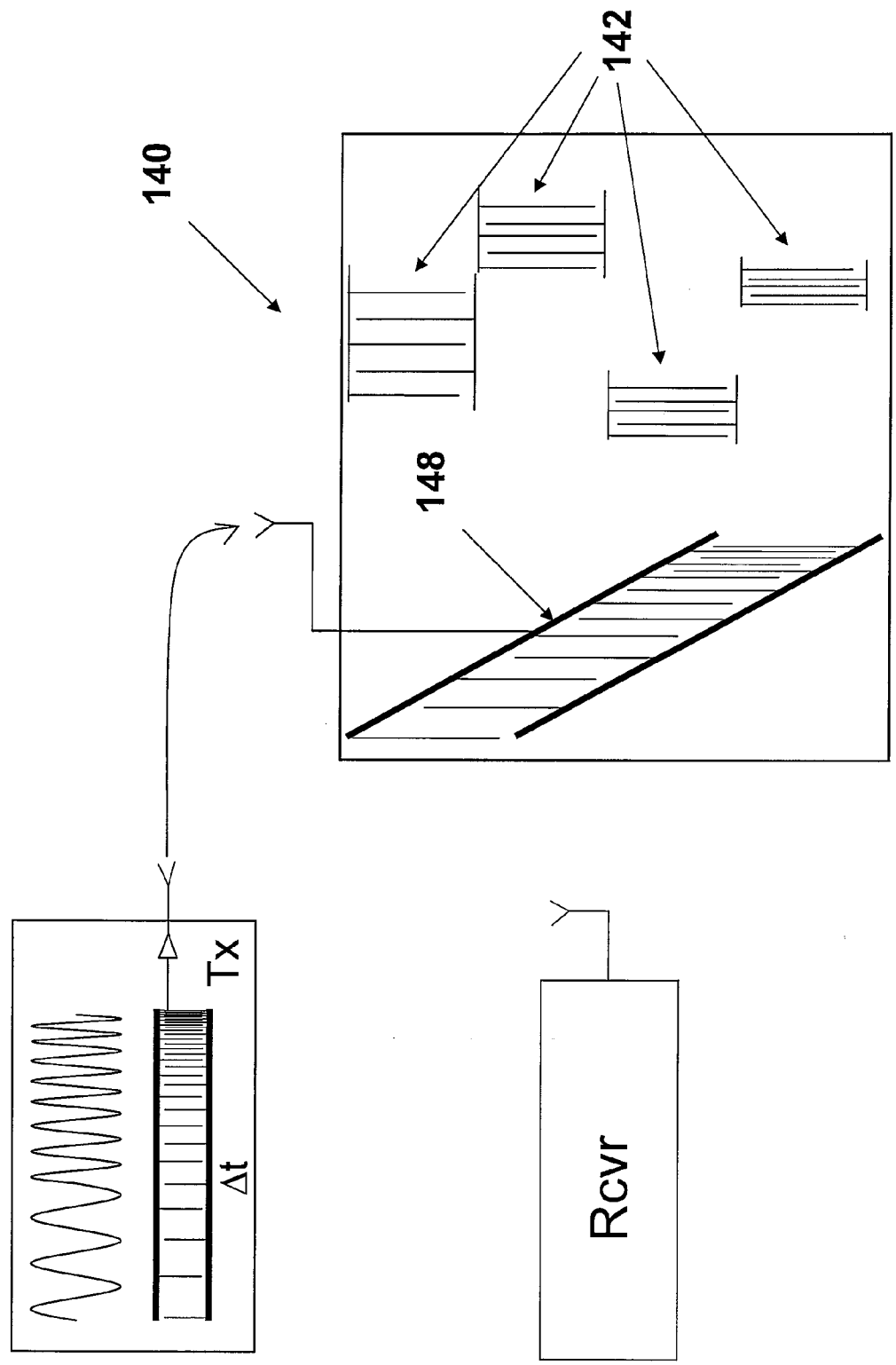
FIG. 7 is a SAW sensor/tag implementation in accordance with a seventh embodiment.

One dispersive SAW ID tag/sensor device embodiment 110 is shown in FIG. 6. In this embodiment, the interrogator 112 sends out an up chirp signal 116 which is picked up by sensor/tag 110. There is a matched chirp filter transducer 118 in the sensor, which compresses the signal and sends a compressed pulse 122 propagating along the surface of the device. This compressed pulse is reflected back from the reflectors 130, producing a string of compressed pulses 124 incident on the transducer. In response to these pulses, the chirp transducer radiates a string of chirp signal pulses 126 back, where the chirp slope of these pulses is the opposite of the originally transmitted signal. The receiver 114 then utilizes a matched filter 120 to compress the chirp pulses and produce a string of compressed pulses for use in identification or measurement. Shown for completeness is an external impedance varying load sensor device 128 electrically connected to one of the reflecting elements. As described in more depth later in this specification, this structure can be used as a wireless interface device to measure changes in impedance of the external sensor 128. One particularly nice aspect of the device structure shown in FIG. 6 is that the environmental reflections still have the same chirp sense as the originally transmitted pulse. Hence, they will be spread further by the matched filter that is used to compress the sensor response. This means that there is no problem with multipath clutter, which means that the nominal delay of the first reflector in the sensor can be made arbitrarily small there is no need for a large pedestal delay as in previous devices. Another advantage of this technique is that it also enhances the strength of the returned bit by the processing gain of the chirped filter pair. There are several means of implementing dispersive filters (in-line dispersive IDT, slanted IDT, etc) and any one would be acceptable to use. It should be noted that this approach, which is drawn in FIG. 6 as a single-track device using an in-line dispersive (chirp) transducer 118 and traditional reflective taps 130, could also be implemented using a slanted dispersive transducer 148 (or stepped tapered or tapered dispersive transducer) and multi-track reflectors with the appropriate bandwidth as shown above for tapered sensor/tags. A specific preferred embodiment would be a tag with a slanted dispersive transducer, and multiple reflectors 142 on either side of the transducer as shown by 140 in FIG. 7. Such a device would have the benefits of avoiding power division loss and increased reflector efficiency (as in the case of the non-dispersive tapered devices above), and the added benefit of avoiding interference from multipath signals arising from environmental reflections of the transmitted chirp.

Figure 8:
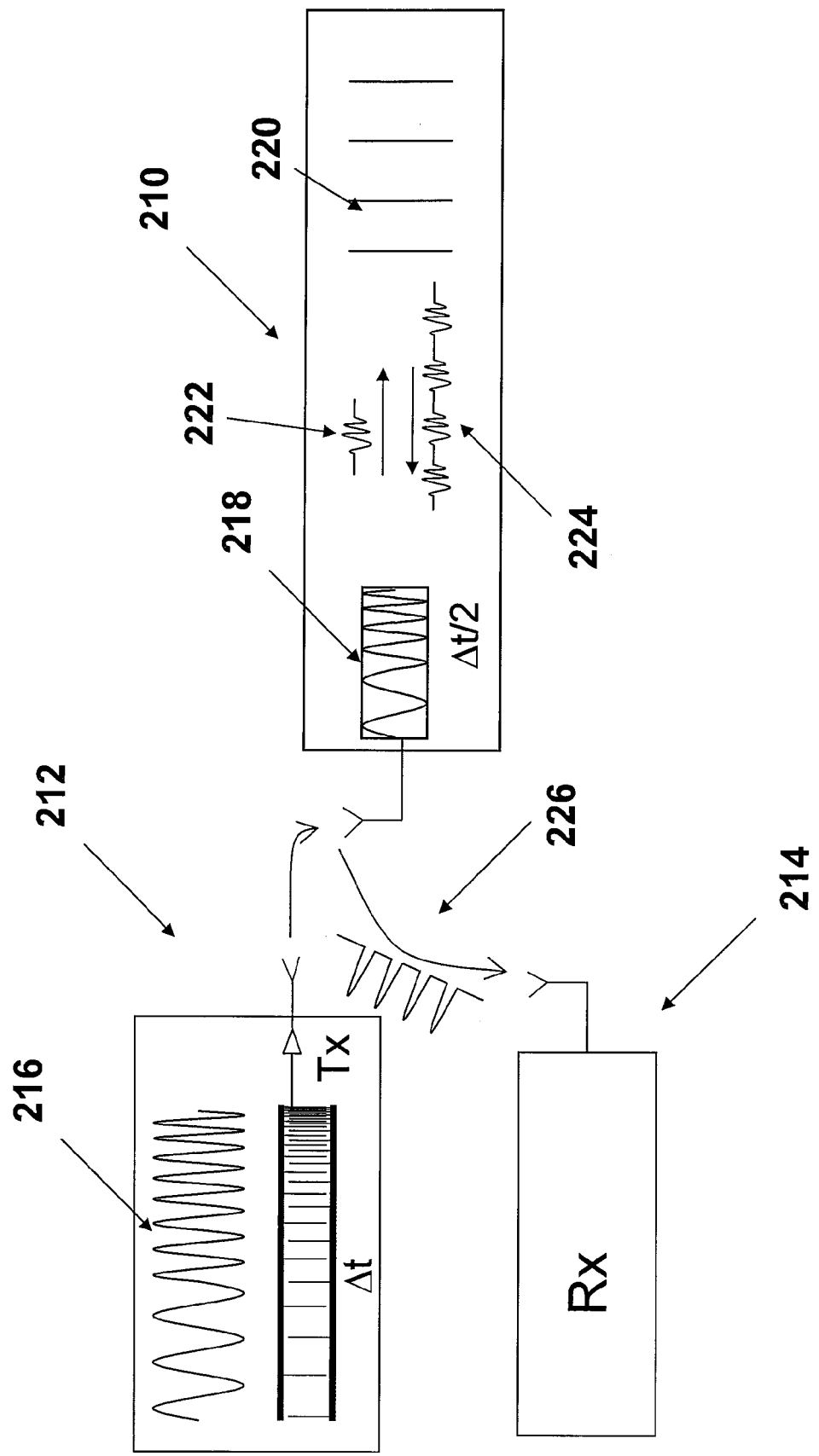
FIG. 8 is a SAW sensor/tag implementation in accordance with a eighth embodiment.

Another embodiment which may be beneficial since each of the reflective taps (each bit of the code) is a wideband reflector and hence takes up less room on the die, is the one shown in FIG. 8. In this embodiment, the interrogator 212 sends out an arbitrary chirp pulse 216 (linear FM is shown by way of example, but nonlinear dispersive responses could be used as well). The chirp pulse is received by a dispersive transducer 218 on the SAW sensor/tag 210 that has a chirp length of ½ the length of the received pulse, and a chirp orientation that is opposite of the received pulse. The transducer compresses the received pulse halfway, and launches this shorter dispersive pulse 222 towards the reflector taps. The reflective taps 220 can be thought of as near-ideal wideband reflectors, and so the pulse incident on each reflector bounces back and propagates back towards the transducer, reversed in time (i.e. if the low frequency portion of the pulse reaches the reflector first, this will also be the first portion to reach the transducer on the return trip). So a series of reflected, time reversed dispersive pulses 224 will be returning to the transducer 218, each with a time delay determined by the reflector location on the chip. Since the transducer is designed to compress these pulses, the signal 226 reflected back to the interrogator receiver 214 would be a stream of compressed pulses. Once again, these compressed pulses would have significantly higher S/N than conventional SAW RFID tag/sensor device responses.

Figure 9:
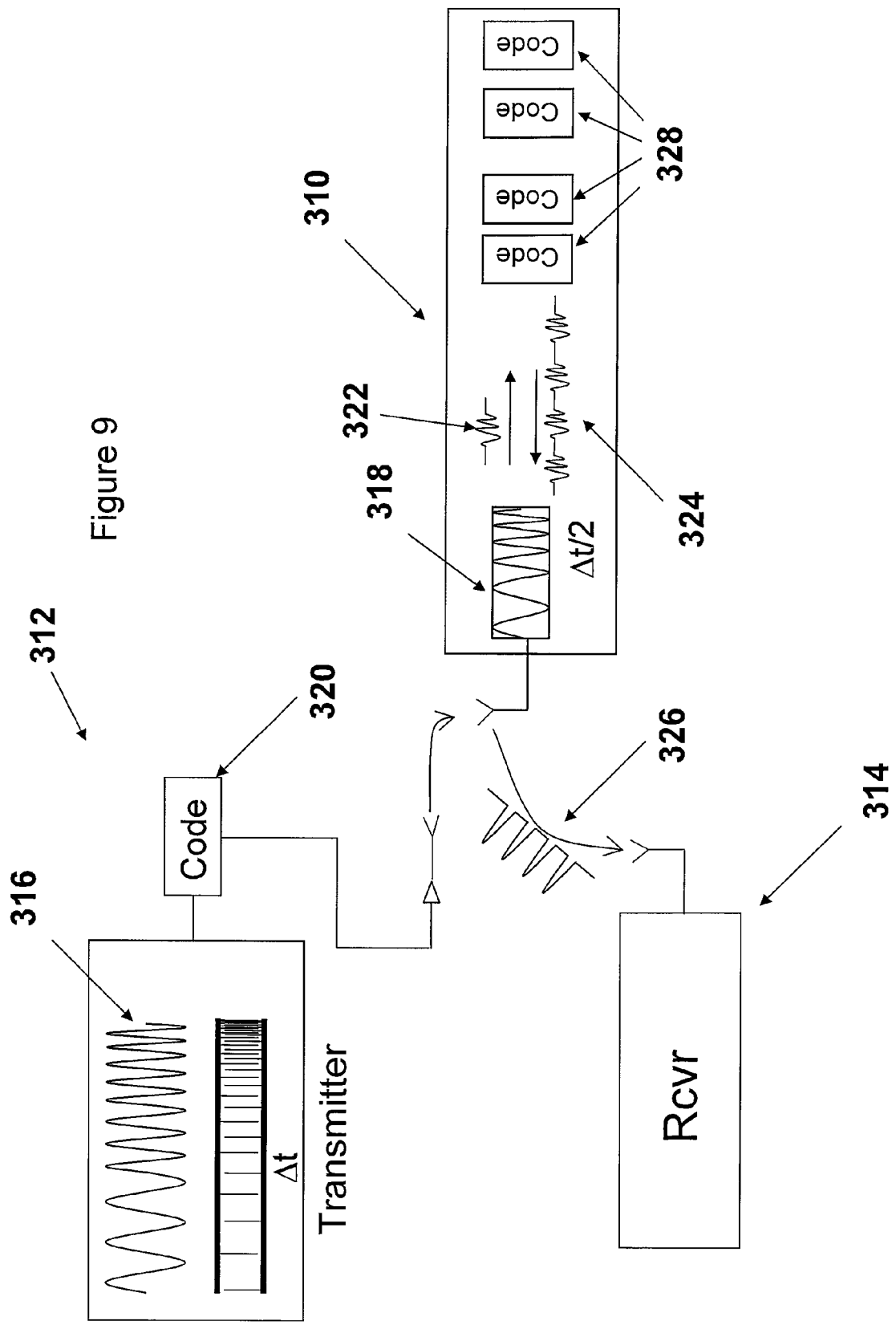
FIG. 9 is a SAW sensor/tag implementation in accordance with a ninth embodiment.

Another dispersive device embodiment 310 is shown in FIG. 9. In this embodiment, a chirp signal 316 feeds an encoder 320 that superimposes another code (any known type of code can be used, a Barker code is one example). The resulting dispersive coded signal is amplified and transmitted by transmitter 312 to the sensor/tag device 310. At the device, a transducer 318 with ½ the chirp length (in time) of the chirp used to generate the signal is used to half-compress the pulse. This produces a coded (again Barker coded for example) and still dispersive signal 322 that propagates towards the reflectors. Each reflector 328 is coded with the same code (again a Barker code for example), and hence compression of this code occurs upon reflection. Thus each reflector reflects back a time reversed and delayed version of the chirp pulse used to generate the original signal, with a time extent of half the original chirp length. These pulses 324 are received by and compressed by the transducer 318, and a sequence of compressed pulses 326 is transmitted back to the interrogator receiver 314. Once again these compressed pulses can have substantially enhanced signal levels relative to conventional sensor/tag devices.

Figure 10:
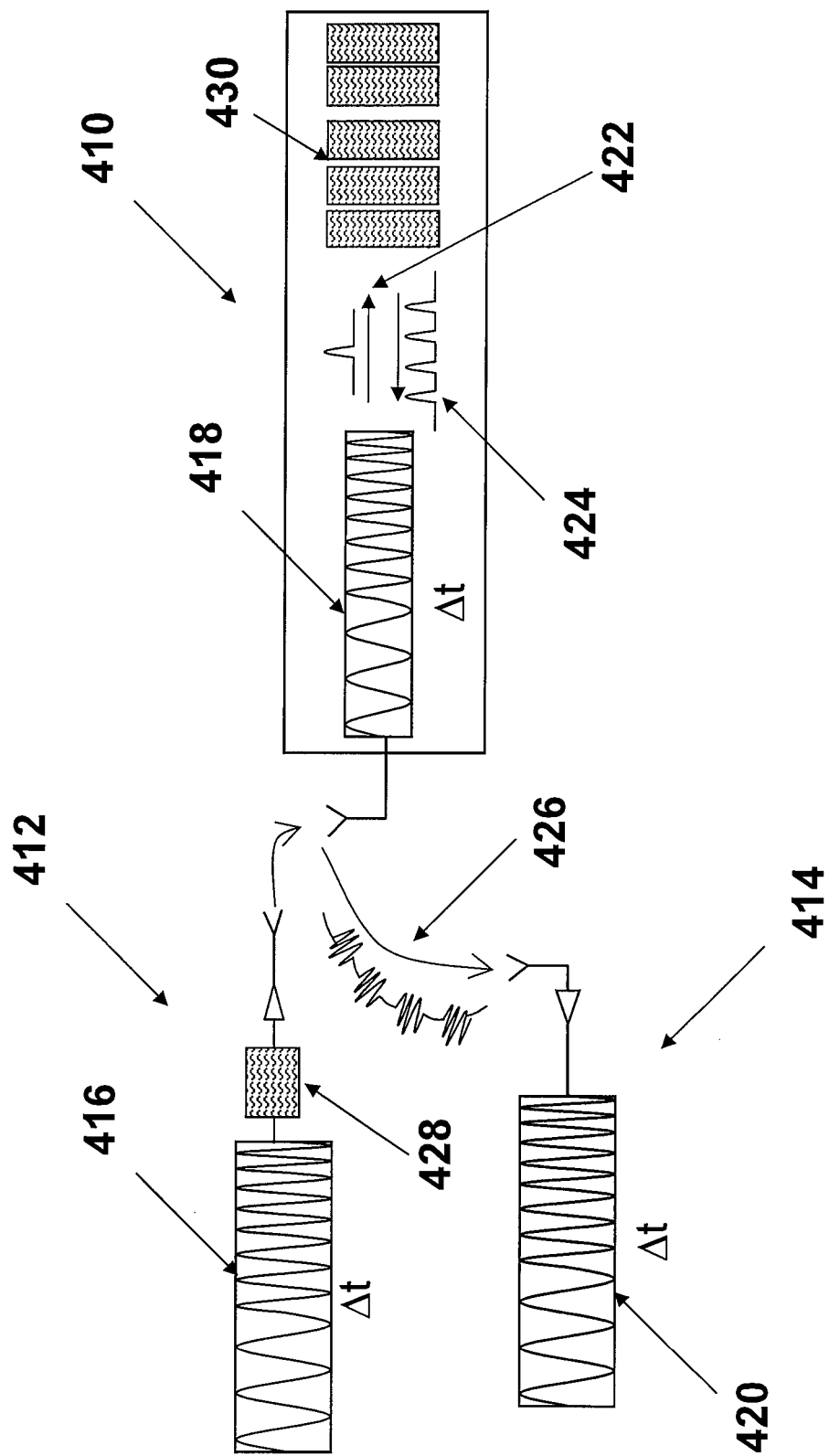
FIG. 10 is a SAW sensor/tag implementation in accordance with a tenth embodiment.

Another sensor embodiment 410 shown in FIG. 10 utilizes a chirped 416 and coded 428 transmitted signal produced by transmitter 412 with a chirp transducer 418 in the sensor/tag 410 to "de-chirp" the signal, producing compressed but still coded pulse 422, and coded reflector segments 430 to correlate with the transmitted code and produce a train of compressed pulses 424 propagating back to the transducer. As shown in FIG. 10, this would require time-symmetric code sequences in order for the code to be half-compressed on the way into each reflector and half-compressed on the way out of each reflector. This generates a train of chirped pulses 426 with a sense that is opposite that of the chirp used in the transmitted signal, which can be compressed with a matched filter 420 in the receiver to produce a train of pulses with delays corresponding to the reflector delays. The received and decoded signal can be used for ID code recognition or sensing, or both depending on the application. Alternatively, the reflectors 430 could compress the code fully and re-reflect a code with the opposite time response, resulting in the signal train 426 returned to the receiver being both chirped and coded, requiring a corresponding code identification device in receiver 414. It is clear that these embodiments will benefit from the same immunity to multipath that the ones shown in FIGS. 6 and 7 demonstrate. Also, it is clear that this could be implemented in a single track layout (as shown), or in a multitrack layout using a slanted transducer (similar to FIG. 7), stepped tapered transducer, or tapered transducer, and that reflectors (in addition to being coded) will be designed to respond to the appropriate bandwidth corresponding to the frequency of the signal propagating in the acoustic path in which they reside.

It will be evident to one skilled in the art that the code generator (428) shown as part of the transmitter in FIGS. 9 and 10 could equally be effected by including a code correlator in the receiver—so the SAW sensor/tag would encode the response and the correlator would decode the response in the receiver. These two system configurations represent the two fundamental multisensor system interrogation paradigms: (1) Send out a signal with a specified code so that only the sensor you want to interrogate will respond strongly, and (2) Send out a broadband pulse so that all sensors within range are activated and respond; allow the sensors to encode their ID on the responses, and use correlation to sort out the combined response in the receiver. In either case, the inclusion of both chirp devices and coding will enhance the system processing gain and enable increased interrogation range. Of course, since we are dealing with reflective delay line-type SAW RFID devices, there is a second level of coding being superimposed on the received response in all of the devices being considered. Hence, in the coded example shown in FIG. 9 or 10, all sensor tag devices with reflectors having the "correct" code will respond strongly—this may still be multiple sensors. It is also understood that the code generator/correlator approach used in these systems can be any of a wide range of known coding schemes and codes.

Figure 11:
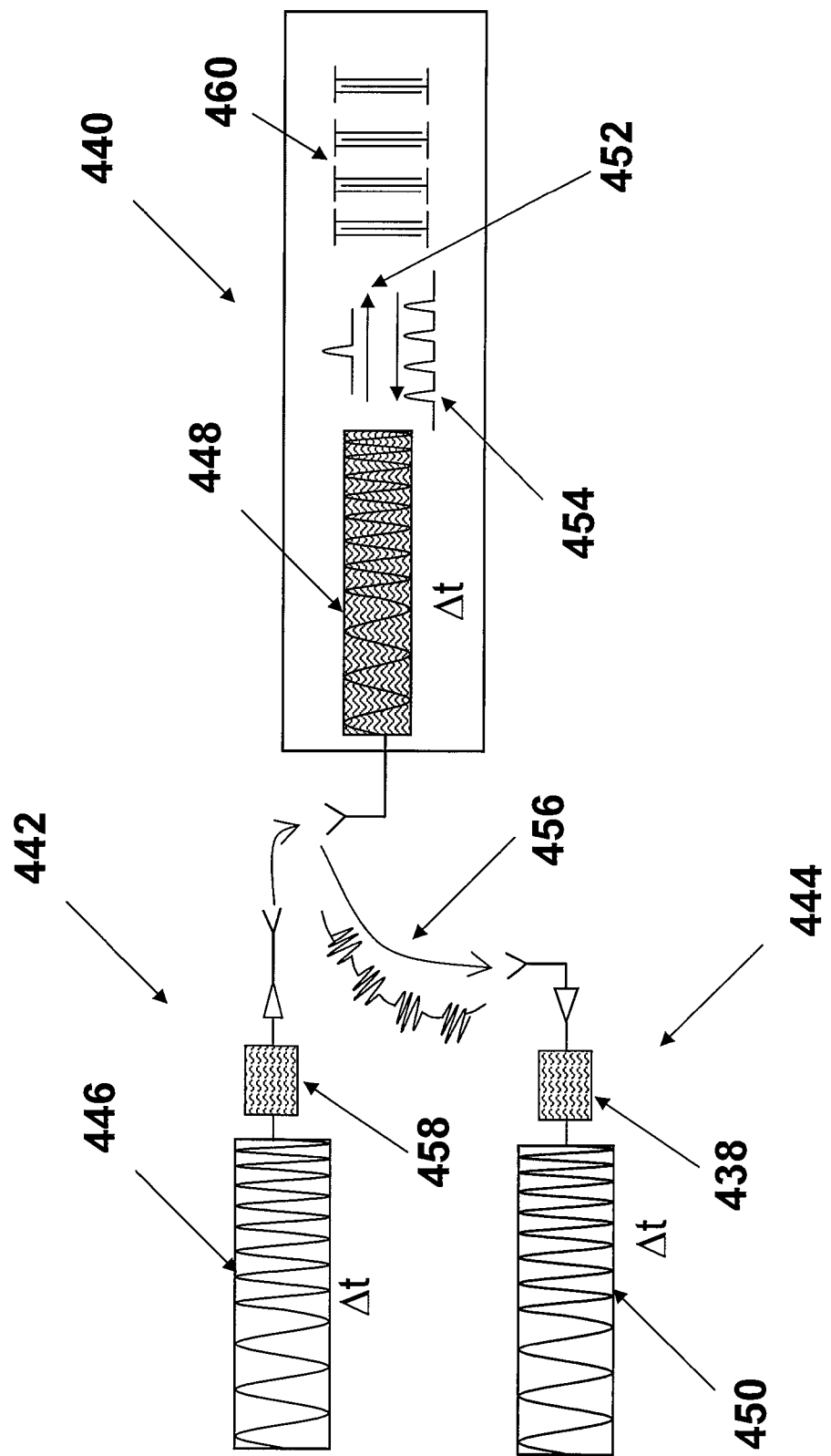
FIG. 11 is a SAW sensor/tag implementation in accordance with a eleventh embodiment.

One additional embodiment 440 is shown in FIG. 11. In this scheme, a chirped (446) coded (458) signal is transmitted by transmitter 442, and received by a transducer 448 that has an impulse response equal to the convolution of the chirp response and the coded response. This transducer compresses the signal to a compressed pulse 452, which propagates and is reflected from the reflectors 460 at specific delay times/phases. The reflected train of compressed pulses 454 interacts with the transducer 448 to produce a train of chirped coded response signals 456, which are then sent to the receiver 444. In the receiver, a correlation device (444 and 450) with a time reversed signal is used to correlate the train of signals to produce the desired compressed pulse train.

Enhancing the sensitivity of devices by using variations in chirp slope in each reflective tap is another possibility. For this case, the receiver would need to compress the received pulse train in such a manner that all the signals can be converted into the appropriate compressed pulses. This is an extension of Reindl's work [12] to the case of multiple delay taps (more than two).

It will also be recognized by one familiar with the prior art that the dispersive devices discussed above that produce compressed pulse trains in the receiver can be utilized with any known pulse measurement scheme to extract data with enhanced resolution. Specifically, the three-tap sequential process used by Jan Kuypers et. al. [6], which determines approximate delay (and thus phase within $2\pi$) and then measures phase to get a fine measurement of the sensed parameter, could be used to advantage with any of the low loss and/or dispersive devices described in this and the previous section.

It would also be understood by one skilled in the art that the dispersive devices discussed herein could be used as sensors, RFID tags, combined sensor/tags, and also as wireless sensor/tag interface devices if properly designed.

Harmonic Response SAW ID Tags and Sensors

Another aspect of the present inventions is the use of harmonic responses to enhance SAW ID tag and sensor response signal to noise ratios and simplify interpretation of the reflected response. Harmonic radar has been used to locate golf balls and skiers buried beneath avalanches. In these applications, an interrogation signal is sent to the ID tags, which interact with the signal and send back a response is at a harmonic of the original signal. This reflected response is easily detected among the backscatter clutter (multipath) signal that reflects from other surroundings, since the backscatter is at the frequency of the originally transmitted signal. Since the desired response is being read at a frequency substantially different from the transmitted signal, there is no need to wait for the immediate response to decay. This substantially enhances signal to noise ratio and detection range.

Applying this concept to SAW devices is not straightforward. SAW devices are inherently linear, and hence will not produce signals at any frequencies other than those in the interrogating signal. In the current invention, a nonlinear device is incorporated with a SAW device to allow the formation of a harmonic response by a SAW device.

Figure 12:
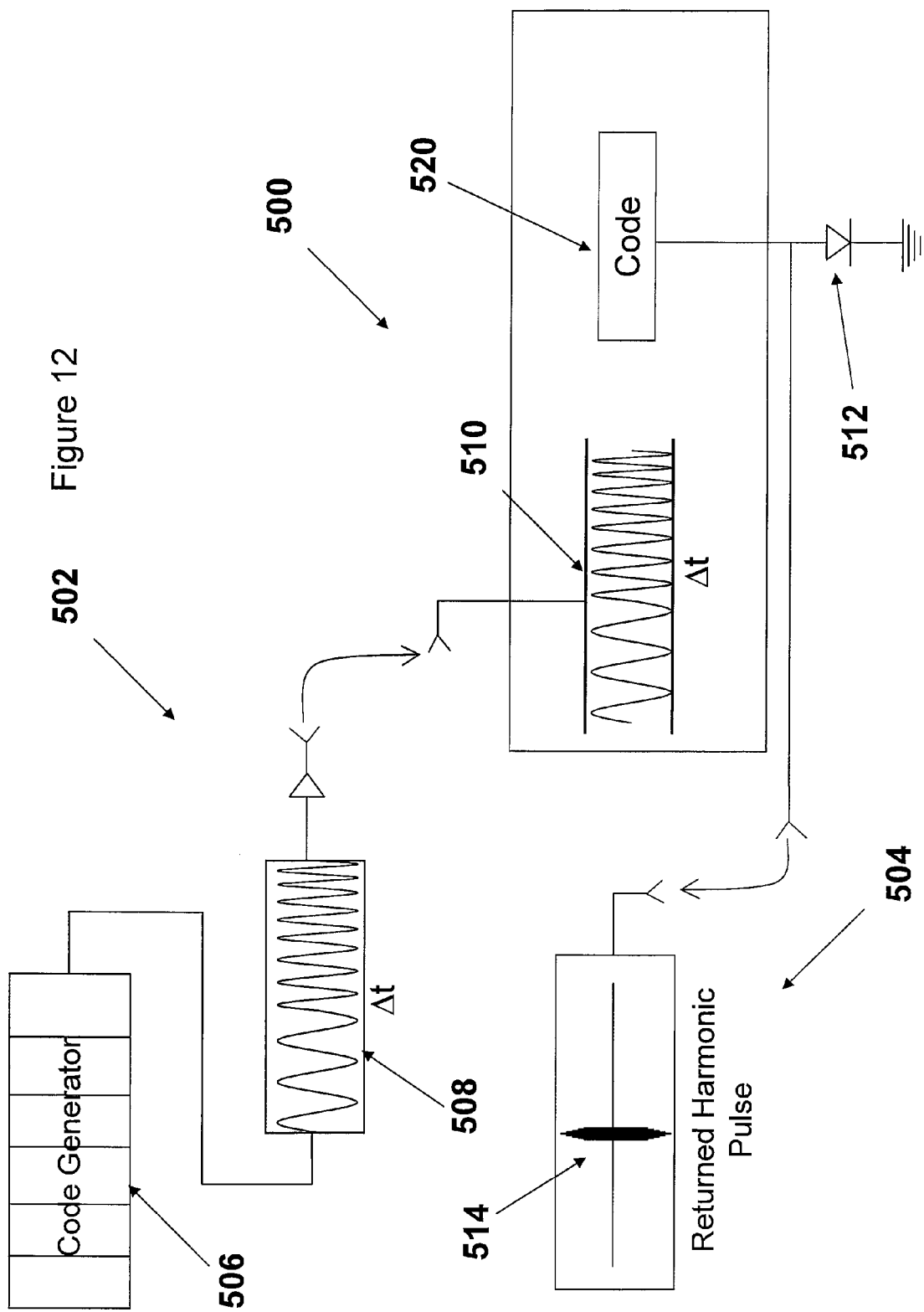
FIG. 12 is a SAW sensor/tag implementation in accordance with a twelfth embodiment.

The first embodiment 502 of this harmonic response SAW wireless sensor/tag system invention is shown in FIG. 12. In this embodiment, which is a two port device (not a single port device as previously shown), an arbitrary code generator 506 (any known coding approach could be used) produces a code, which is then expanded using a chirp device 508, and transmitted to the sensor/tag 500. In the sensor/tag device, the transducer 510 first compresses the chirp portion of the signal, and the coded transducer 520 correlates with the code, resulting in a compressed pulse. This compressed pulse is formed in the coded transducer 520, which is connected with a nonlinear device 512 (any of a number of nonlinear devices could be used, a diode is shown in this example). The compressing of the SAW energy into a pulse that is short in time concentrates the energy from the wideband, long time duration signal into a short burst with high voltage amplitude on the SAW transducer busbars. Relative to the low amplitude received interrogation signal, the amplitude of this voltage is increased by the time bandwith product of the dispersive and coded waveforms (i.e. processing gain) at the instant when the acoustic wave generates the compressed pulse at the output busbars, and reduced by the insertion loss of the SAW device. Provided the voltage is high enough, the nonlinear device 512 will operate on the pulse to produce a signal containing harmonics. For the example shown, the diode will rectify the waveform, producing an electrical signal containing harmonics of the signal at the busbar of the transducer. In general, multiple harmonics may be produced, depending on the specifics of the nonlinear device used. For the example of FIG. 12, using a diode in particular, the second harmonic will be generated. This harmonic response is re-radiated back to the interrogator receiver 504 along with the fundamental response. The receiver will be designed to preferentially detect the second harmonic response 514, which is free of multipath clutter and all other ringing caused by the fundamental transmitted signal.

Figure 13:
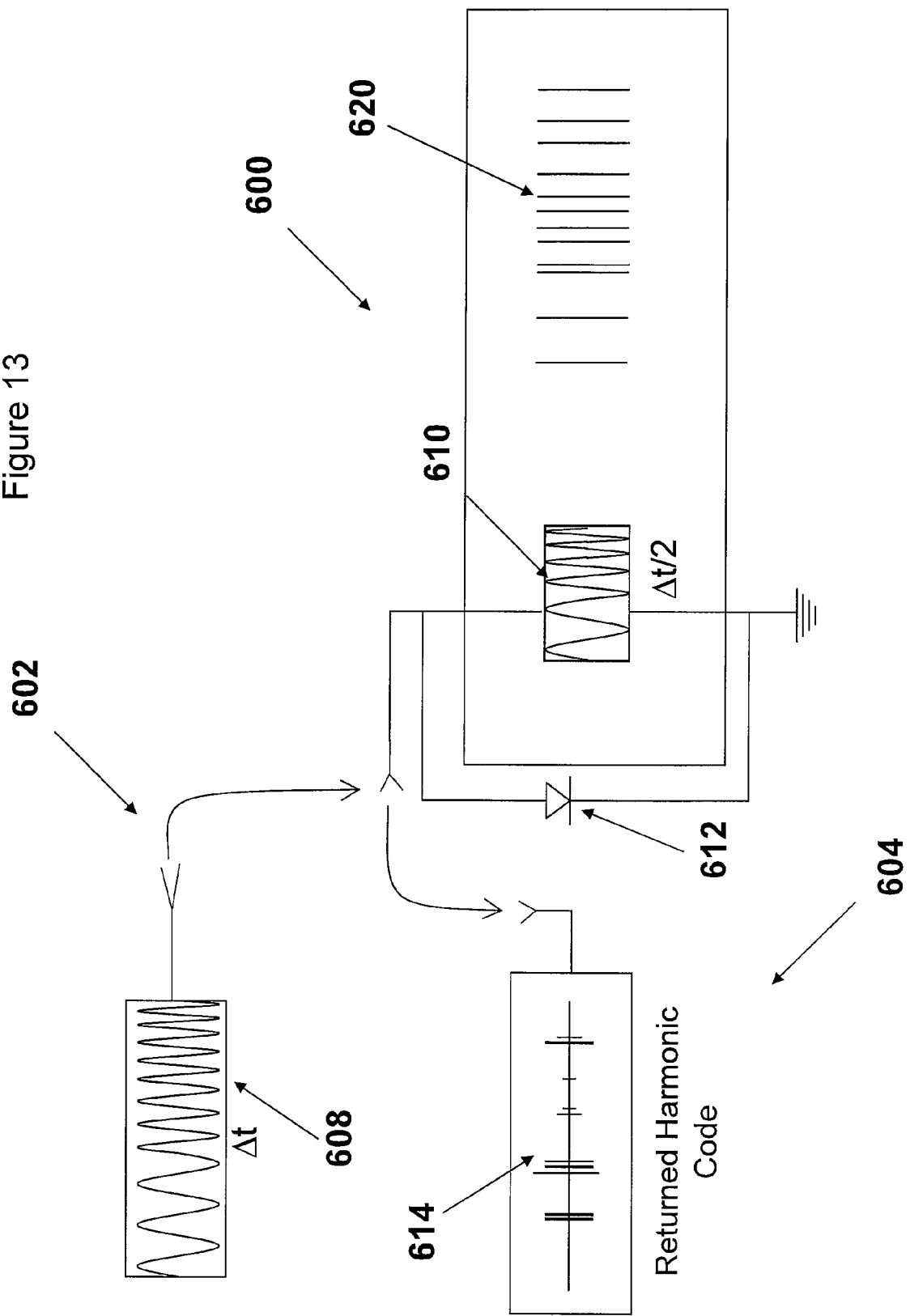
FIG. 13 is a SAW sensor/tag implementation in accordance with a thirteenth embodiment.

FIG. 13 illustrates a one-port version of the device shown in FIG. 12. Operation of this device is similar, with transmitter 602 transmitting a chirp signal 608 (amplification and additional coding have not been shown for simplicity, but could also be employed) to sensor/tag 600. On the tag, transducer 610 half-compresses the chirp, resulting in a pulse that travels along the substrate and reflects from reflectors 620, forming a train of half compressed reflected pulses. These pulses are further compressed by transducer 610, resulting in a train of compressed pulses forming on the SAW sensor/tag transducer 610, and causing the diode 612 (or other nonlinear device) to produce an electrical harmonic response in response to the high amplitude compressed pulses. Once again, the processing gain of the filters allow the low amplitude signal received by the sensor to pass through the diode without producing a harmonic response, whereas the high amplitude of the compressed pulse causes the diode to generate the desired harmonic electrical response (second harmonic when the nonlinear device is a diode as shown). The train of harmonic pulses 614 is received by receiver 604 and interpreted for identification and/or sensing response.

Either of these embodiments avoid a common problem in radar detection systems, i.e. that the transmitted signal is so strong that it can overpower the reflected received signal. Under this system the returned signal is at a completely different frequency, therefore the radar transmitter and receiver can run simultaneously rather than cycling on and off.

It is within the scope of this invention that this approach can be combined with any of the aforementioned multi-track low loss device structures to produce harmonic response SAW RFID sensor/tags. Similarly, such techniques can be used with impedance loaded devices as described below. The use of a diode to introduce the required nonlinearity and generate the desired harmonic is a convenient choice, but the use of any other electronic component that introduces such a nonlinearity and results in generation of a harmonic electrical response is within the scope of this invention. It is also within the scope of this invention to use any other known technique to generate a harmonic response within a SAW device, including introducing acoustic defects or irregularities, utilizing wave propagation modes that interact in a nonlinear fashion, incorporating semiconductor overlayers (or layers of other materials such as oxides, gold, and other metals).

SAW Sensor/Tag Wireless Interfaces

It is well known in the prior art [7, 15-17] that SAW reflective delay line and resonant RFID devices can be used as wireless interface devices by connecting sensors that vary in electrical impedance with changes in the quantity to be measured to a SAW element, such as a transducer or reflector.

The current invention extends this concept to take advantage of the low loss provided by utilizing tapered transducers and reflectors, and/or the high processing gain provided by using dispersive device configurations (and the reduction in interference from backscatter produced using selected dispersive configurations), and/or the immunity to interference from the fundamental response provided by using a harmonic response device structure. A combination of any or all of these features is also possible. Which aspects of device performance will be most critical and hence the preferred embodiment will vary from application to application.

Figure 14:
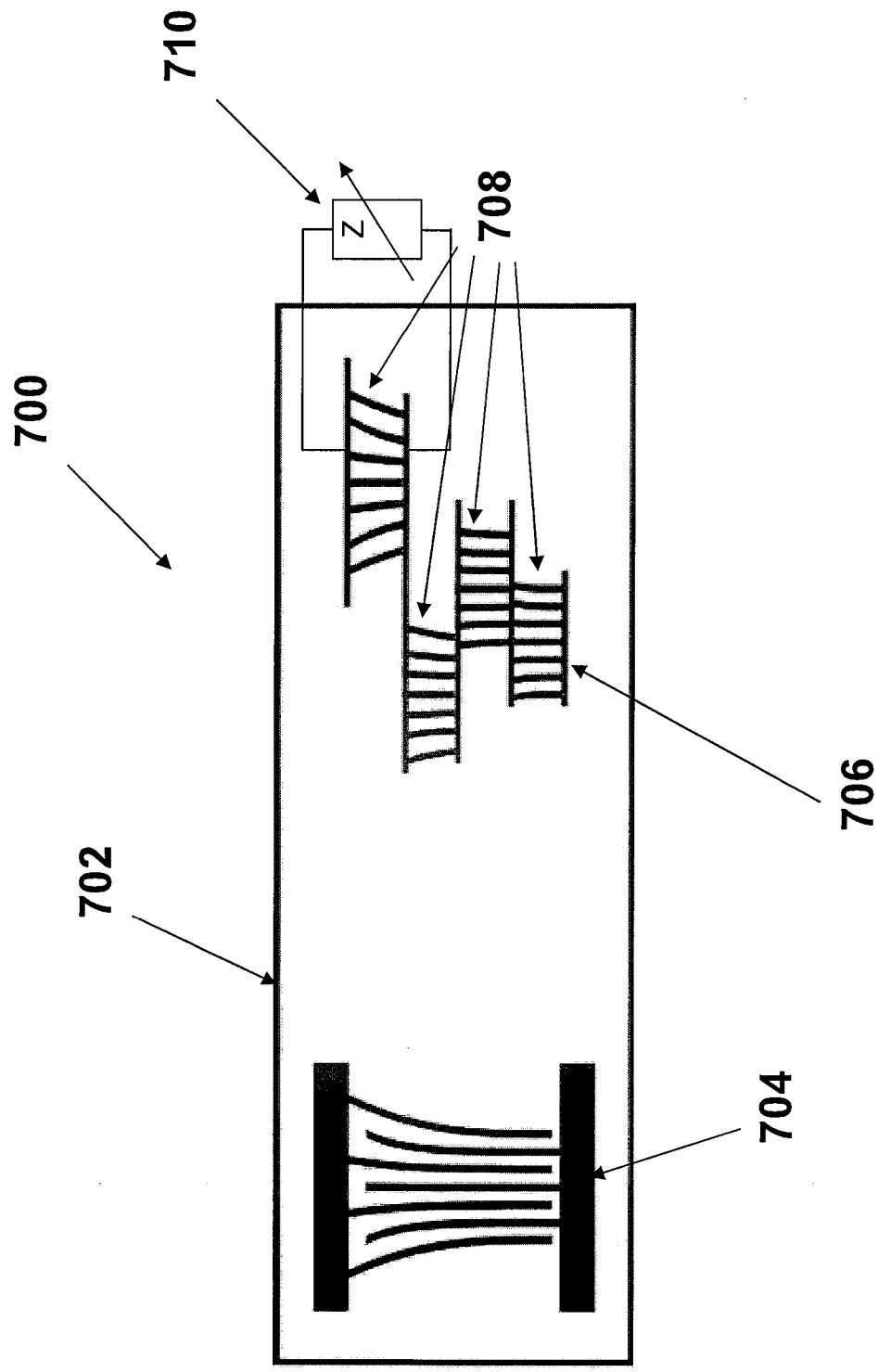
FIG. 14 is a SAW sensor/tag implementation in accordance with a fourteenth embodiment.

As one example, FIG. 14 shows a sensor interface device embodiment 700 where, on a piezoelectric substrate 702, are located tapered transducer 704 and an additional tapered transducer 706 with four sub-band tapered reflectors 708 located at different delays. One of the reflectors (shown here schematically as a reflective transducer) is connected to a variable impedance sensor 710. Changes in the sensor impedance will alter the reflectivity of the reflective transducer. The precise electrode structure of the reflectors is not illustrated in this figure, which is only schematic in nature. The other reflectors can similarly be shorted or open circuited electrodes, or transducers, and reflector types can be mixed within the same device. Additional sensors can be attached across other reflectors to provide a combined multisensor interface using one device. Techniques such as the three tap response analysis of Kuypers (among others) can be used to selectively analyze each sensor response relative to reference taps. In addition, this approach of attaching external sensors to selected reflectors or transducers can also be used to modify the responses produced using dispersive reflector devices, providing wireless interface devices with enhanced processing gain. FIG. 6 illustrates such an embodiment. Operation of this device has been described previously, and here we emphasize its use as an interface device to wirelessly monitor one or more external impedance varying sensor(s).

It will be clear to one skilled in the art that, as in Brocato [15], external sensors that vary in response to external influences with changes in voltage can be attached to normally-on (i.e. zero or near zero-bias) transistors (such as FETs) such that the externally generated voltage is applied to the FET gate and the SAW reflective element is connected across the FET drain and source. Voltage variations on the FET gate modulate the drain to source impedance of the FET, effectively loading the SAW and causing changes in reflected device response. Such an approach using any of the above mentioned device embodiments is within the scope of the present invention.

Conclusion

The broad nature of the inventions described here are clear, and one skilled in the art will understand that there is a wide variety of device configurations that can be generated using combinations of one or more of the techniques discussed. The inventions described herein and illustrated in the figures provide device embodiments capable of operating with lower insertion loss, greater processing gain, and hence longer interrogation range than those currently available. In addition, techniques for producing devices immune to the effects of interference from backscatter of the fundamental frequency transmitted signal have been described. In general, the tradeoffs between desired die size, interrogation range, and required number of codes in a multisensor or RFID application will determine which of the approaches is most desirable.

The invention claimed is:

1. A coded surface acoustic wave device, comprising
(a) a piezoelectric substrate;
(b) one first transducer arranged on at least a portion of said piezoelectric substrate wherein said first transducer has electrode structures that vary in width and separation along the transducer in the direction of acoustic wave propagation so as to be capable of interacting with a received spread spectrum signal to at least partially compress said received spread spectrum signal into a signal that is shorter in time, and to generate and receive acoustic waves on the substrate corresponding to said shorter signal;
(c) at least one second surface acoustic wave element formed on said piezoelectric substrate and spaced from and not in electrical contact with said first transducer along the direction of acoustic wave propagation, said at least one second surface acoustic wave element comprising sub elements, each of which comprises electrode structures capable of interacting with acoustic waves at frequencies that correspond to at least a subset of the frequencies generated by said first transducer;
(d) wherein said sub-elements of said at least one second surface acoustic wave element are spatially distributed along said piezoelectric substrate in the direction of acoustic wave propagation; and wherein said at least one second surface acoustic wave element is structured such that said sub-elements of said second surface acoustic wave element are spaced at different positions in the direction of acoustic wave propagation relative to the corresponding portion of said first transducer, so as to effect different delays to each of said sub-elements, thereby effecting a code.

2. A wireless interface device for one or more external sensors that respond to changes in environmental parameters with a change in impedance, comprising:

(a) A coded surface acoustic wave device as in claim 1;
(b) wherein at least one of said sub-elements of said second surface acoustic wave element comprise a transducer that is electrically connected to one of said at least one external sensors;
(c) wherein changes in properties of the external sensor result in a change in properties of the surface acoustic wave reflected by said sub-element connected to said external sensor.

3. A wireless interface device for one or more external sensors that respond to changes in environmental parameters with a change in voltage, comprising:
(a) A coded surface acoustic wave device as in claim 1;
(b) wherein at least one of said sub-elements of said second surface acoustic wave element comprise a transducer that is electrically connected to a normally-on transistor, which is connected to one of said at least one external sensors;
(c) wherein changes in properties of the external sensor result in a change in properties of the surface acoustic wave reflected by said sub-element connected to said external sensor.

4. A coded surface acoustic wave device as described in claim 1, further comprising coded sections in said sub-elements of said second surface acoustic wave element.

5. A wireless sensor system, comprising
(a) a transmitting part operable to produce a spread spectrum signal of a defined time extent and bandwidth and to transmit said spread spectrum signal through an antenna;
(b) at least one coded surface acoustic wave device as in claim 1, wherein said one first transducer, which is connected to an antenna, is designed to fully compress the spread spectrum signal transmitted by the transmitting part and to generate an acoustic wave pulse into the substrate that is short in time as compared to the transmitted signal received by said first transducer; and
(c) wherein said at least one second surface acoustic wave element comprises a set of reflectors suitable to reflect said short acoustic wave pulse at defined delays, to produce a string of reflected short acoustic pulses;
(d) wherein said string of reflected short acoustic wave pulses activate said one first transducer to produce a string of spread spectrum signals that is re-transmitted through the antenna connected to said one first transducer; and
(e) a receiving part operable to receive said re-transmitted string of spread spectrum signals and to compress said spread spectrum signals to compressed pulses that are short in time.

6. A wireless sensor system, comprising
(a) a transmitting part operable to produce a spread spectrum signal of a defined time extent and bandwidth and to transmit said spread spectrum signal through an antenna;
(b) least one coded surface acoustic wave device as in claim 1, wherein said one first transducer, which is connected to an antenna, is designed to half compress the spread spectrum signal transmitted by the transmitting part and to generate an acoustic wave pulse into the substrate that is half the length in time of the transmitted signal received by said first transducer; and
(c) wherein said at least one second surface acoustic wave element comprises a set of reflectors suitable to reflect said half compressed acoustic wave pulse at defined delays, to produce a string of reflected half compressed acoustic pulses;
(d) wherein said string of reflected half compressed acoustic wave pulses are further compressed by said one first transducer to produce a string of compressed pulses that is re-transmitted through the antenna connected to said one first transducer; and
(e) a receiving part operable to receive said re-transmitted string of compressed pulses.

7. A wireless sensor system as described in claim 5
(a) wherein said at least one second surface acoustic wave element further comprises a set of reflectors that each incorporate a code; and
(b) wherein said string of spread-spectrum signals re-transmitted by the coded acoustic wave device comprises a string of coded spread-spectrum signals; and
(c) wherein said receiving part is further operable to perform code correlation or matched filtering on said string of received signals.

8. A wireless sensor system as described in claim 6
(a) wherein said at least one second surface acoustic wave element further comprises a set of reflectors that each incorporate a code; and
(b) wherein said string of spread-spectrum signals re-transmitted by the coded acoustic wave device comprises a string of coded spread-spectrum signals; and
(c) wherein said receiving part is further operable to perform code correlation or matched filtering on said string of received pulses.

9. A coded wireless sensor device comprising
(a) a coded surface acoustic wave device as in claim 1;
(b) wherein said at least one second surface acoustic wave element further comprises multiple reflector and/or transducer elements, at least one of which serves as a reference response and the others of which serve as sensor responses to one or more parameters influencing the SAW propagation.

10. A wireless sensor system, comprising
(a) a transmitting part operable to produce a spread spectrum signal of a defined time extent and bandwidth and to transmit said spread spectrum signal through an antenna;
(b) least one coded surface acoustic wave device as in claim 1, wherein said one first transducer, which is connected to an antenna, is designed to partially compress the spread spectrum signal transmitted by the transmitting part and to generate an acoustic wave pulse into the substrate that is shorter in time as compared to the transmitted signal received by said first transducer but not fully compressed; and
(c) wherein said at least one second surface acoustic wave element comprises a set of reflectors suitable to reflect said shorter acoustic wave pulse at defined delays, to produce a string of reflected shorter acoustic pulses;
(d) wherein said string of reflected shorter acoustic wave pulses activate said one first transducer to produce a string of further compressed but not fully compressed signals that is re-transmitted through the antenna connected to said one first transducer; and
(e) a receiving part operable to receive said re-transmitted string of signals and to compress said signals to fully compressed pulses that are short in time.

11. A wireless sensor system as set forth in claim 10, wherein:
said at least one second surface acoustic wave element further comprises a set of reflectors that each incorporate a code;

said string of spread-spectrum signals re-transmitted by the coded acoustic wave device comprises a string of coded spread-spectrum signals; and said receiving part is further operable to perform code correlation or matched filtering on said string of received signals.

12. A wireless sensor system as set forth in claim 10, wherein said at least one second surface acoustic wave element further comprises multiple reflector and/or transducer elements, at least one of which serves as a reference response and the others of which serve as sensor responses to one or more parameters influencing the SAW propagation.

13. A coded surface acoustic wave device as in claim 1, wherein said one first transducer further comprises a coded element.

14. A coded surface acoustic wave device, comprising
(a) a piezoelectric substrate;
(b) one first transducer arranged on at least a portion of said piezoelectric substrate wherein said first transducer has electrode structures that vary in width and separation along the transducer in the direction of acoustic wave propagation so as to be capable of interacting with a received spread spectrum signal to at least partially compress said received spread spectrum signal into a signal that is shorter in time, and to generate and receive acoustic waves on the substrate corresponding to said shorter signal;
(c) at least one second surface acoustic wave element formed on said piezoelectric substrate and spaced from and not in electrical contact with said first transducer along the direction of acoustic wave propagation, said at least one second surface acoustic wave element comprising sub elements, each of which comprises electrode structures capable of interacting with acoustic waves at frequencies that correspond to a subset of the frequencies generated by said first transducer;
(d) wherein said sub-elements of said at least one second surface acoustic wave element are spatially distributed along said piezoelectric substrate in the direction of acoustic wave propagation; and wherein said at least one second surface acoustic wave element is structured such that said sub-elements of said second surface acoustic wave element are spaced at different positions in the direction of acoustic wave propagation relative to the corresponding portion of said first transducer, so as to effect different delays to each of said sub-elements, thereby effecting a code; and
(e) wherein said second surface acoustic wave element is connected to a non-linear device operable to generate a harmonic response.

15. A wireless interface device for one or more external sensors that respond to changes in environmental parameters with a change in impedance, comprising:
(a) A coded surface acoustic wave device as in claim 14;
(b) wherein at least one of said sub-elements of said second surface acoustic wave element comprise a transducer that is electrically connected to one of said at least one external sensors;
(c) wherein changes in properties of the external sensor result in a change in properties of the surface acoustic wave reflected by said sub-element connected to said external sensor.

16. A wireless interface device for one or more external sensors that respond to changes in environmental parameters with a change in voltage, comprising:
(a) A coded surface acoustic wave device as in claim 14;
(b) wherein at least one of said sub-elements of said second surface acoustic wave element comprise a transducer that is electrically connected to a normally-on transistor, which is connected to one of said at least one external sensors;
(c) wherein changes in properties of the external sensor result in a change in properties of the surface acoustic wave reflected by said sub-element connected to said external sensor.

17. A coded surface acoustic wave device, comprising
(a) a piezoelectric substrate;
(b) one first transducer arranged on at least a portion of said piezoelectric substrate wherein said first transducer has electrode structures that vary in width and separation along the transducer in the direction of acoustic wave propagation so as to be capable of interacting with a received spread spectrum signal to at least partially compress said received spread spectrum signal into a signal that is shorter in time, and to generate and receive acoustic waves at frequencies on the substrate corresponding to said shorter signal;
(c) at least one second surface acoustic wave element formed on said piezoelectric substrate and spaced from and not in electrical contact with said first transducer along the direction of acoustic wave propagation, said at least one second surface acoustic wave element comprising sub elements, each of which comprises electrode structures capable of interacting with acoustic waves at frequencies that correspond to a subset of the frequencies generated by said first transducer;
(d) wherein said sub-elements of said at least one second surface acoustic wave element are spatially distributed along said piezoelectric substrate in the direction of acoustic wave propagation; and wherein said at least one second surface acoustic wave element is structured such that said sub-elements of said second surface acoustic wave element are spaced at different positions in the direction of acoustic wave propagation relative to the corresponding portion of said first transducer, so as to effect different delays to each of said sub-elements, thereby effecting a code; and
(e) wherein said first transducer is connected to a non-linear device operable to generate a harmonic response.

18. A wireless interface device for one or more external sensors that respond to changes in environmental parameters with a change in impedance, comprising:
(a) A coded surface acoustic wave device as in claim 17;
(b) wherein at least one of said sub-elements of said second surface acoustic wave element comprise a transducer that is electrically connected to one of said at least one external sensors;
(c) wherein changes in properties of the external sensor result in a change in properties of the surface acoustic wave reflected by said sub-element connected to said external sensor.

19. A wireless interface device for one or more external sensors that respond to changes in environmental parameters with a change in voltage, comprising:
(a) A coded surface acoustic wave device as in claim 17;
(b) wherein at least one of said sub-elements of said second surface acoustic wave element comprise a transducer that is electrically connected to a normally-on transistor, which is connected to one of said at least one external sensors;

(c) wherein changes in properties of the external sensor result in a change in properties of the surface acoustic wave reflected by said sub-element connected to said external sensor.

20. A wireless interface device for one or more external sensors that respond to changes in environmental parameters with a change in voltage, comprising:

(a) a piezoelectric substrate;

(b) at least one first transducer arranged on at least a portion of said piezoelectric substrate wherein said first transducer has electrode structures that vary in width and separation so as to be capable of generating and receiving acoustic waves in spatially adjacent acoustic tracks at frequencies that vary laterally across the transducer acoustic aperture in the direction perpendicular to the direction of acoustic wave propagation;

(c) at least one second surface acoustic wave element formed on said piezoelectric substrate and spaced from said first transducer along the direction of acoustic wave propagation, said at least one second surface acoustic wave element comprising sub elements, each of which comprises electrode structures capable of interacting with acoustic waves at frequencies that correspond to a subset of the frequencies generated by said first transducer;

(d) wherein said sub-elements of said at least one second surface acoustic wave element are spatially distributed laterally across the acoustic aperture to match the lateral spatial distribution of frequencies in said first transducer; and wherein said at least one second surface acoustic wave element is structured such that said sub-elements of said second surface acoustic wave element are spaced at different positions in the direction of acoustic wave propagation relative to the corresponding portion of said first transducer, so as to effect different delays within each of said acoustic tracks, thereby effecting a code;

(e) wherein at least one of said sub-elements of said second surface acoustic wave element comprise a transducer that is electrically connected to one of said at least one external sensors; and (f) wherein changes in properties of the external sensor result in a change in properties of the surface acoustic wave reflected by said sub-element connected to said external sensor.

* * * * *

UNITED STATES PATENT AND TRADEMARK OFFICE
CERTIFICATE OF CORRECTION

| | | Page 1 of 1 |
|---|---|---|
| PATENT NO. | : 8,441,168 B2 | |
| APPLICATION NO. | : 12/537006 | |
| DATED | : May 14, 2013 | |
| INVENTOR(S) | : Hines et al. | |

It is certified that error appears in the above-identified patent and that said Letters Patent is hereby corrected as shown below:

In the Specification

Please insert at column 1, line 4, after the title, and before the "Related Application" section, the following:

--STATEMENT OF GOVERNMENT INTEREST

This invention was made with Government support under NNX09CE49P awarded by the National Aeronautics and Space Administration (NASA). The Government has certain rights in the invention.--

Signed and Sealed this
Twelfth Day of August, 2014

Michelle K. Lee
*Deputy Director of the United States Patent and Trademark Office*